United States Patent [19]

Suzuki et al.

[11] Patent Number: 4,882,263
[45] Date of Patent: * Nov. 21, 1989

[54] METHOD OF TREATING PHOTORESISTS

[75] Inventors: Shinji Suzuki, Kawasaki; Tetsuji Arai, Yokohama; Kazuyoshi Ueki, Kawasaki; Yoshiki Mimura, Yokohama; Hiroko Suzuki, Kawasaki, all of Japan

[73] Assignee: Usho Denki, Tokyo, Japan

[*] Notice: The portion of the term of this patent subsequent to Feb. 1, 1989 has been disclaimed.

[21] Appl. No.: 146,927

[22] Filed: Jan. 22, 1988

[30] Foreign Application Priority Data

Mar. 24, 1987 [JP] Japan .................................. 62-67890

[51] Int. Cl.$^4$ ............................................. G03C 5/16
[52] U.S. Cl. .................................... 430/328; 430/326
[58] Field of Search ........................ 430/326, 328, 330

[56] References Cited

U.S. PATENT DOCUMENTS 4,548,688 10/1985 Matthews ....................... 204/159.18
4,749,436 6/1988 Minato et al. ......................... 156/345

OTHER PUBLICATIONS

Matthews et al, "Stabilzation of Single Layer and Multilayer Resist Patterns . . . " Fusion Semiconductor Systems, SPIE Conf., Optical Microlithography 111, Calif., Mar. 14–15, 1984.
UV Hardening of Photo and Electron Beam Resist Patterns, J. Va. Scl. Technol., 19(4), Nov./Dec. 1981.
High Temperature Flow Resistance of Micron Sized Images in AZ Resists H. Hiraoka and J. Pacansky, IBM Research Laboratory, San Jose, Calif.
Deep U.V. Hardening of Positive Photoresist Patterns Journal of the Electrochemical Society, Jun. 1982.
Stabilization of Single Layer and Multilayer Resist Patterns to Aluminum Etching Environments, Fusion Semiconductor Systems, Mar. 1984.
Deep UV Hardening of Photo- and Electron Resist Patterns 1984 Dry Process Symposium, Matsushita Electronics Corporation.
Double Exposure Stabilization of Positive Photoresist Journal of Applied Polymer Science, Vo. 30, 547–555 (1985).

Primary Examiner—Jose G. Dees
Attorney, Agent, or Firm—Armstrong, Nikaido, Marmelstein, Kubovcik & Murray

[57] ABSTRACT

Ultraviolet radiation process applies to manufacture to semiconductor devices in order to enhance the thermal stability of the developed positive photoresist film on semiconductor's wafers.

A method, in ultraviolet radiation process, and an apparatus enabling the high-speed and effective treatment of the positive photoresist employing ultraviolet irradiation by preventing the deformation of the positive photoresist which is caused by the light radiated form the microwave-excited electrodeless discharge lamp. These method and apparatus employ ultraviolet irradiation, in which ultraviolet rays are applied to the developed positive photoresist image placed under lower or pressure than 1 atmospheric pressure, using a means to intercept or reduce selectively all or part of the wavelengths in the spectral response region of the positive photoresist out of radiant lights obtained from the microwave-excited electrodeless discharge lamp.

2 Claims, 2 Drawing Sheets

METHOD OF TREATING PHOTORESISTS

BACKGROUND OF THE INVENTION

1. Field of the Invention

This invention relates to a method and an apparatus of treating photoresist materials applied on semiconductor wafer and, more particularly, to a method and an apparatus of treating the photoresist materials placed under a low atmospheric pressure employing ultraviolet irradiation.

2. Description of the Prior Art

As for the prior-art treatment of a photoresist employing ultraviolet irradiation, exposing the photoresist to ultraviolet radiation is utilized in a treatment in which a mask pattern is formed by exposing the photoresist applied on a semiconductor wafer, etc., and recently attention has been paid to the application of this method to particular treatments of photoresists such as baking photoresist materials.

The baking process is an intermediate between a process of forming a photoresist pattern by applying, exposing and developing the photoresist and a process of executing ion implantation, plasma-etching, etc. by using the photoresist pattern, and it is a heating process executed for improving the adhesiveness of the photoresist to a semiconductor substrate, heat-resistance, etc. While a reference of H. Hiraoka and J. Pacansky: J. Vac, Sci Tech. 19(1981), and U.S. application Ser. No. 923,504, abandoned have been made recently on a method in which ultraviolet rays are applied to the photoresist image after or during the baking process after development so as to enhance the heat-resistance and plasma-resistance of the photoresist through the baking process in a shorter time.

When a light having a high ultraviolet intensity, such as a radiant light from a microwave-excited electrodeless discharge lamp having a high ultraviolet radiation efficiency, is applied to the photoresist to expedite the treatment, however, a gas is generated from the photoresist, and this gas causes the formation of bubbles, deformation of a photoresist pattern and deformation of a photoresist film, such as exfoliation, rupture or roughening thereof, thus causing imperfections of a semiconductor element.

It can be supposed that the generation of this gas is caused by a rapid photochemical reaction of the light sensitive radicals of the photoresist, by the photochemical reaction of HMDS(hexamethyldisilazine), which is applied to a wafer as a preliminary treatment for the application of the photoresist, or an antireflection coating, etc. on the photoresist, by the photochemical reaction of an additive to the photoresist such as dyestuff, by the photochemical reaction of a solvent remaining in the photoresist, etc.

These photochemical reactions are advanced remarkably by a light having a wavelength 300 nm to 500 nm, and more particularly, by a light having a wavelength in the spectral response region of the photoresist. Accordingly, when a microwave-excited electrodeless discharge lamp radiating a light including these wavelength areas is employed, the intensity of light cannot be enhanced. In other words, this apparatus has a problem that it cannot perform a high-speed treatment.

SUMMARY OF THE INVENTION

An object of this invention is to provide a method and an apparatus enabling the high-speed and effective treatment of the photoresist image employing ultraviolet irradiation by preventing the deformation of the developed positive photoresist image which is caused by the light radiated from the microwave-excited electrodeless discharge lamp.

Ultraviolet rays are applied to the positive photoresist image, using a means to intercept or reduce selectively all or part of the wavelengths in the spectral response region of the photoresist out of radiant lights obtained from the microwave-excited electrodeless discharge lamp.

In this way, the photochemical reactions causing the generation of the gas from the photoresist are depressed and thus the deformation of the developed positive photoresist image on a wafer is prevented, even when the microwave-excited electrodeless discharge lamp radiating strongly the light in the wavelength region exerting destructive actions on the positive photoresist together with ultraviolet rays being effective for improving the heat-resistance and plasma-etching-resistance of the positive photoresist is employed, since the light in the wavelength region exerting said destructive actions is not applied onto the developed positive photoresist image placed in a chamber of lower pressure, or since the intensity of this light is sufficiently weak, even if it is applied.

Moreover, the light applied to the positive photoresist still contains a strong ultraviolet component being effective for improving the heat-resistance and plasma-etching-resistance of the positive photoresist even when the wavelengths in the spectral response region of the positive photoresist are intercepted or reduced.

Accordingly, a method enabling high-speed and effective treatment of the developed positive photoresist image on a wafer is accomplished.

Other objects and advantages of this invention will become apparent from the following description of the preferred embodiment of the invention, in conjunction with the accompanying drawings.

DESCRIPTION OF THE PREFERRED EMBODIMENT

This invention will be described concretely hereinafter on the basis of embodiments shown in accompanying drawings.

Figure 1:
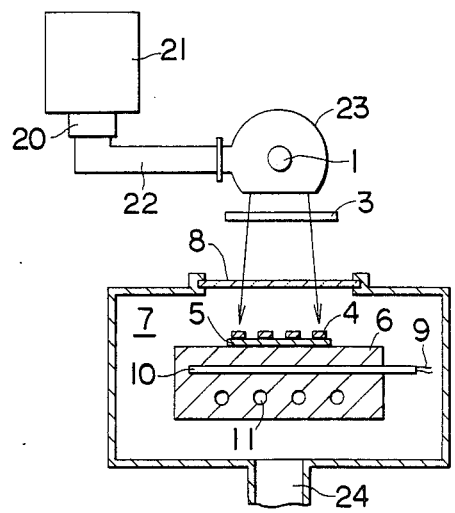
FIG. 1 shows an apparatus of treating a photoresist for explaining one embodiment of a method of treating a developed positive photoresist image on a wafer according to this invention.

In FIG. 1 a chamber 7 has a radiation window 8 formed of quartz glass at the top and an exhaust hole 24 at the bottom. The exhaust hole 24 is connected to a vacuum pump, not shown, which reduces the pressure of gas in the chamber 7 to approximately $1 \times 10^{-1}$ torr.

A pattern of a photoresist image 4 is formed on a semiconductor wafer 5, which is placed on a support 6. The support 6 is heated by a heater 10 connected with power supply through a heater lead wire 9, or cooled down by cooling water to flow through a cooling conduit 11. The temperature of the semiconductor wafer 5 is controlled by these heating and cooling mechanisms. Ultraviolet irradiation source arranged on the upper part of radiation window 8 is composed of a microwave-excited electrodeless discharge lamp 1, a magnetron 20, a power supply 21, a wave guide 22, a cavity resonator 23 with a light-reflecting mirror, not shown in the Figure, disposed inside, a filter 3, etc..

The magnetron 20 supplied with a power from the power supply 21 oscillates a microwave having a frequency of 2450 MHz. The microwave thus generated is guided in the cavity resonator 23 and forms a strong microwave magnetic field in the cavity resonator 23. By this strong microwave magnetic field, the gas in the microwave-excited electrodeless discharge lamp 1 is excited, so as to radiate a light containing ultraviolet lights.

As for a gas filled in the microwave-excited electrodeless discharge lamp 1, a rare gas such as argon gas is used, and it is known that an addition of a small quantity of mercury thereto effects the radiation of strong ultraviolet rays. An electrodeless discharge lamp radiating strongly a light having a wavelength of 220 nm to 230 nm is disclosed in Japanese Unexamined Patent Publication No. ("KOKAI KOHO" in Japan) 59-87751(U.S. application Ser. No. 433,069), and this lamp may be used well, but the wavelength region of ultraviolet rays which is effective for improving the heat-resistance and plasma-etching-resistance of a positive photoresist is so wide as 220 nm to 300 nm, and therefore an electrodeless discharge lamp radiating a strong light in this region is preferable. In this regard, a suitable electrodeless discharge lamp radiating a strong light in the region of 220 nm to 300 nm is attained by adding more mercury than disclosed in the aforesaid Japanese Unexamined Patent Publication.

The radiant light from the microwave-excited electrodeless discharge lamp 1 is passed through the filter 3, etc., and applied to the developed positive photoresist image 4 on a wafer placed under pressure than 1 atmospheric pressure. As for the filter 3, a filter intercepting or reducing a light in the wavelength region of 300 nm to 500 nm, that is, a wavelength region including the wavelengths in the spectral response region of the positive photoresist, is employed herein, and thereby the treatment of the positive photoresist employing ultraviolet irradiation can be performed effectively.

It is suitable to employ a filter prepared by forming a multilayer evaporation film on a glass plate, for obtaining the characteristic of intercepting or reducing the light in the wavelength region of 300 nm to 500 nm. The glass preferable for this filter is of the fused silica glass showing a large transmittance of ultraviolet rays of a wavelength 300 nm or below which are effective for the improvement in the heat-resistance and plasma-etching-resistance of the developed positive photoresist image.

By using this apparatus, the radiant light from the microwave-excited electrodeless discharge lamp is applied to a sample which was prepared by using HPR-1182, OFPR-800, OFPR-5000 and TSMR-8800 as the positive photoresist, and HMDS as an chemical agent which is applied to a wafer as a preliminary treatment for the application of the photoresist. While deformation took place in any samples of said photoresist image when the aforesaid filter was not employed, no deformation of the same photoresist image occurred and the heat-resistance and plasma-etching-resistance of said image were improved when this filter was employed so as to intercept the light of 300 nm to 500 nm.

A microwave-excited electrodeless discharge lamp which contains a filling comprised of mercury and argon gas radiates strongly the lights of wavelength 312 nm, 365 nm, 405 nm and 436 nm. When this lamp and a narrow-band filter intercepting these lights are employed, deformation of the positive photoresist image does not occur either. Moreover, when the photoresist image is treated by placing in lower pressure than 1 atmospheric pressure, the time for treating said photoresist image is shorten, which is 1/5 times by comparison with the time in the air of 1 atmosphere pressure.

Figure 2:
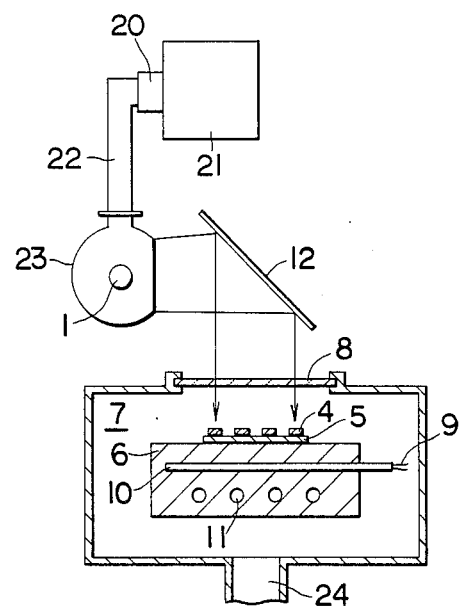
FIG. 2 shows another apparatus of treating a photoresist for explaining another embodiment.
Figure 3:
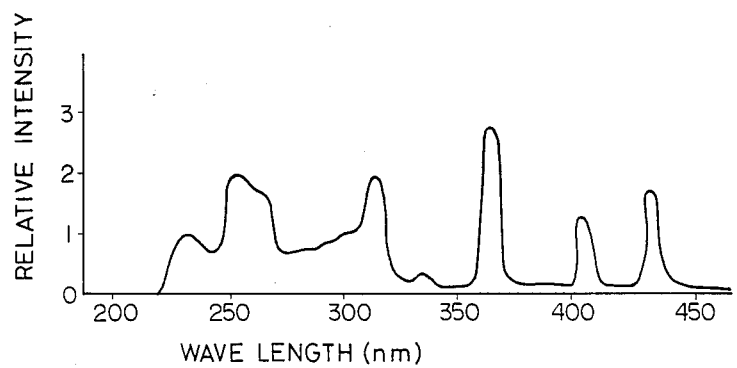
FIG. 3 shows one example of the radiation spectrum of the microwave-excited electrodeless discharge lamp employed in this invention.
Figure 4:
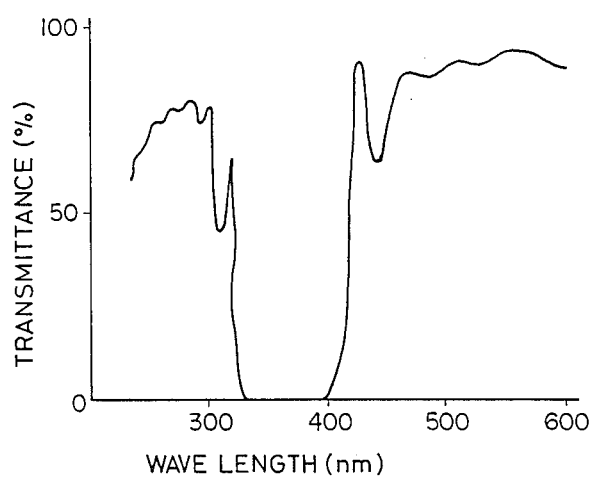
FIG. 4 shows one example of the spectral transmittance characteristics of the filter employed in this invention.

FIG. 2 shows another embodiment in which a mirror is employed as a means to intercept or reduce the radiant light in wavelength region of 300 nm to 500 nm. The mirror 12 employed herein has a characteristic of reflecting a radiant light in a wavelength region below 300 nm and not reflecting the radiant light of 300 nm to 500 nm. A mirror formed by evaporation of a multilayer film is suitable also for the mirror having the above-mentioned characteristic. The same effect as in the apparatus illustrated in FIG. 1, in which the filter is employed, can be attained also in the apparatus illustrated in FIG. 2, in which the mirror having the said characteristic is employed. When a conventional mirror reflecting the whole of the radiant light from the electrodeless discharge lamp is employed instead of the mirror having the aforesaid characteristic, deformation took place in the aforesaid samples of the developed positive photoresist image.

In the above-mentioned embodiment, the electrodeless discharge lamp which contains the filling comprised of mercury and argon gas is used to enable the radiation of ultraviolet lights of high intensity. Another gas usable to this lamp may be employed. A filling comprised of gas and a very small quantity of metal other than mercury in the form of a halide, for instance, may be used as well on condition that the electrodeless discharge lamp containing the filling radiates ultraviolet rays of a prescribed wavelength, and further a filling comprised of mercury and a rare gas other than argon or of mercury and mixed gas which consists of rare gases other than argon, may also be employed.

As for the frequency of a microwave, it is not limited to 2450 MHz, and a microwave having another frequency may be used on condition that it can excite the gas enclosed in the lamp efficiently. Moreover, a high frequency whose wavelength is longer than the microwave may be used as well.

In addition to the above-described embodiments, the filter or the mirror is employed separately as a means to intercept or reduce the light having the wavelengths in the spectral response region of the positive photoresist. It is a matter of course that various combination of different filters and mirrors may be employed.

What is claimed:
1. A method of enhancing thermal stability of a developed positive photoresist image on a semiconductor wafer comprising the steps of:
  energizing a microwave-excited electrodeless discharge lamp to provide a range of radiant energy including wavelengths of 300 nm to 500 nm,
  selectively filtering wavelengths in the spectral response region of said photoresist image from said radiant energy, placing the developed positive photoresist image in a chamber having a gas at a pressure lower than $1 \times 10^{-1}$ torr atmospheric pressure, and exposing said photoresist image to the wavelengths remaining in said radiant energy after said filtering step.

2. The method defined by claim 1 wherein said gas is air and said microwave-excited electrodeless discharge lamp is a mercury vapor lamp.

* * * * *